United States Patent [19]

Takano

[11] Patent Number: 4,801,873
[45] Date of Patent: Jan. 31, 1989

[54] WAVEFORM MEASURING APPARATUS WITH MARKER ZONE DISPLAYING FUNCTION

[75] Inventor: Mitsuyoshi Takano, Tokyo, Japan

[73] Assignee: Anritsu Corporation, Tokyo, Japan

[21] Appl. No.: 163,020

[22] Filed: Mar. 2, 1988

[30] Foreign Application Priority Data

Mar. 6, 1987 [JP] Japan .................. 62-51707

[51] Int. Cl.$^4$ .......................................... G01R 23/16
[52] U.S. Cl. ................................ 324/77 R; 324/77 B
[58] Field of Search ............... 364/485, 487, 518, 521; 324/77 R, 77 B, 77 D; 340/709, 711; 328/138, 141, 155

[56] References Cited

U.S. PATENT DOCUMENTS

| | | | |
|---|---|---|---|
| 4,244,024 | 1/1981 | Marzalek et al. .................... | 364/485 |
| 4,253,152 | 2/1981 | Holdaway ............................ | 364/485 |
| 4,257,104 | 3/1981 | Martin et al. ....................... | 364/485 |
| 4,264,958 | 4/1981 | Rowell, Jr. ......................... | 324/77 B |
| 4,529,930 | 7/1985 | Evel .................................... | 324/77 A |
| 4,568,878 | 2/1986 | Bales ................................... | 324/77 B |
| 4,607,215 | 8/1986 | Takano ................................ | 324/77 B |
| 4,611,164 | 9/1986 | Mitsuyoshi ......................... | 324/77 B |
| 4,611,343 | 9/1986 | Rapaich ............................... | 324/77 B |
| 4,649,496 | 3/1987 | Anderson ............................. | 364/485 |
| 4,660,150 | 4/1987 | Anderson ............................. | 364/485 |

FOREIGN PATENT DOCUMENTS

0153479  9/1985  European Pat. Off. .
59-3264  1/1984  Japan .

Primary Examiner—Michael J. Tokar
Attorney, Agent, or Firm—Frishauf, Holtz, Goodman & Woodward

[57] ABSTRACT

An input section outputs a digital signal representing a characteristic value corresponding to a measurement range of an input signal. The digital signal is then stored in a memory. A display displays the digital signal stored in the memory as an image which is developed along one of two-dimensional coordinates axes and represents the predetermined characteristic value. A zone setting section outputs zone width data for setting, as a marker zone, a portion including a desired range of the one axis for the image displayed on the display. A zone display controller causes the display to display the marker zone, in accordance with the zone width data. A detector reads out the digital signal within the desired range of the one axis, from the memory, in accordance with the zone width data, and detects the specific characteristic value in the readout digital signal. A display controller causes a display to display detected specific characteristic value data.

18 Claims, 5 Drawing Sheets

WAVEFORM MEASURING APPARATUS WITH MARKER ZONE DISPLAYING FUNCTION

BACKGROUND OF THE INVENTION

1. Field of the Invention

This invention relates to a waveform measuring apparatus and, more particularly, to a waveform measuring apparatus with a marker zone displaying function, which includes a signal analyzer such as a spectrum analyzer (including an optical spectrum analyzer), a network analyzer, or the like.

Also, this invention relates to a waveform measuring apparatus such as a spectrum analyzer for analyzing a signal and displaying a waveform such as a spectrum. Of waveforms such as spectra displayed on a display screen, a desired waveform zone is quickly selected, and specific characteristic values such as a maximum level and a corresponding frequency within the selected zone are detected and displayed.

2. Description of the Related Art

When a spectrum of an unknown signal is analyzed and evaluated, the level and frequency of the spectrum of interest must be detected first.

However, in practice, elements constituting the spectrum analyzer have a limited resolution, and the waveform of the spectrum of interest is not displayed by a single line. That is, the upper portion of the spectrum is represented by a moderate curve and the lower portion thereof has an inverted V-shape, with variations depending on measurement conditions. The level and frequency of the maximum level point of the inverted V-shaped spectrum display correspond to the level and frequency of the spectrum of interest. Thus, the maximum point of the spectrum must be searched. Many spectra are present in neighboring frequency regions. For this reason, in order to measure the levels and frequencies of these spectra, each spectrum must be selected, and the maximum level point of each spectrum on the display screen must be detected. In some cases, the spectrum may be displayed in a V shape. In this case, the level and frequency of the minimum level point correspond to those of the spectrum of interest. In the following description, a case will be described wherein an inverted V-shaped spectrum is displayed. The related arts associated with a method of displaying a spectrum and its maximum level and frequency will be described below.

The first related art is a digital storage type spectrum analyzer which stores level data of a spectrum in correspondence with a frequency, and then displays the data on a display screen. In this analyzer, a spot is set at a desired position of a spectrum waveform on the display screen. A frequency is detected based on the position of the spot on the frequency axis, and the level corresponding to the frequency indicated by the spot is detected from the memory, thereby displaying these values.

The second related art is a so-called peak search function and a next peak search function performed in a digital spectrum analyzer having a memory as in the first related art. In the peak search function, a maximum level is searched from level data stored in the memory, and a frequency corresponding to the maximum level is detected and displayed. A spot is set at a position corresponding to the maximum level point in the entire frequency region on the display screen.

In the next peak search function, the second highest level point in the frequency region on the display screen, i.e., the second highest spectrum level and its frequency are detected.

The third related art is an analog spectrum analyzer which analog-displays level data of a spectrum without using the above-mentioned memory. In this spectrum analyzer, a desired frequency range and position are set on the spectrum waveform on the display screen to be visually observed, and the maximum level within the frequency range is held in an analog manner, thereby displaying its maximum level.

The above related arts have the following drawbacks.

The first related art is convenient for detecting a level and frequency at a desired point on a spectrum of interest on the display screen. However, in order to accurately set the spot at the maximum point of the spectrum, the spot must be moved and this operation is time-consuming. In a digital display, if a design is made to improve a resolution along the frequency axis in order to allow visual observation of a displayed image in an analog manner, the setting resolution of the spot is improved accordingly and accuracy is also improved. However, a distance for moving the spot from the left to the right end of the display screen is prolonged, and setting of the spot takes much time. A signal for setting the position of the spot is manually generated, and it must be visually confirmed whether or not the spot is set. Since the setting of the spot must be visually confirmed, a delay time or inertia is generated due to a transient response of a circuit present between a manual operation and setting of a spot on the display screen, and manual operation cannot be synchronized with from visual confirmation. Therefore, it is difficult to quickly set a spot at a desired position, and this operation is time-consuming. When the spectrum display on the display screen has a inverted V-shape, it is difficult to find the maximum level point unless the maximum level point is determined after a portion regarded as a maximum level point is searched once using the spot. In this method, if the frequency of the unknown signal to be observed varies, the position of the spot is also offset from the maximum level point. Therefore, the position of the spot must be reset.

In the second related art, when many spectra are displayed on the display screen, a level and frequency of a desired spectrum, in particular, a spectrum having a lower level, cannot be detected. In the peak search function, even if the frequency of a signal to be measured is varied, the spot can follow the variation without being offset from the maximum level point as long as the frequency falls within the entire frequency region on the display screen. However, in the next peak search function, if the frequency and/or level of each spectrum is changed, it is difficult to accurately detect it.

In the third related art, a maximum level in a given frequency range of a spectrum on the display screen is displayed. However, the frequency of the spectrum cannot b detected and displayed. Since the peak hold circuit is realized by an analog circuit, this circuit cannot be operated in correspondence with frequencies. Therefore, when the maximum level is detected, it is difficult to specify the frequency of the level.

The drawbacks of the related arts are as described above.

These drawbacks are also presented when waveforms including wavelengths and physical characteristics are displayed, as well as a case wherein a spectrum is displayed.

SUMMARY OF THE INVENTION

It is, therefore, an object of the present invention to provide a new and improved waveform measuring apparatus with a marker zone displaying function, in which a desired waveform zone of a waveform displayed on a display screen can be quickly displayed, and specific characteristics values in the zone can be quickly and clearly displayed.

According to the present invention, there is provided a waveform measuring apparatus comprising:

input processing means for processing an input signal to be measured and outputting the input signal as a digital signal which represents a predetermined characteristic value corresponding to a predetermined measurement range;

memory means, connected to the input processing means, for storing the digital signal;

display means, connected to the memory means, for displaying the digital signal stored in the memory means as an image which is developed along one of the two-dimensional coordinates axes and represents the predetermined characteristic value;

zone setting means for outputting zone width data for designating, as a marker zone, a portion which includes a desired range of the one axis for the image displayed on the display means;

zone display control means, connected to the zone setting means and the display means, for causing the display means to display the marker zone in accordance with the zone width data;

detection means, connected to the memory means and the zone setting means, for reading out the digital signal within the desired range of the one axis from the memory means in accordance with the zone width data, and detecting a specific characteristic value in a readout digital signal; and display control means, connected to the detection means and the display means, for causing the display means to display detected specific characteristic value data.

BRIEF DESCRIPTION OF THE DRAWINGS

These and other objects and features of the present invention can be understood through the following embodiments by reference to the accompanying drawings, in which.

DESCRIPTION OF THE PREFERRED EMBODIMENTS

The principle of the present invention will be described first, as applied to a spectrum analyzer.

Figure 1:
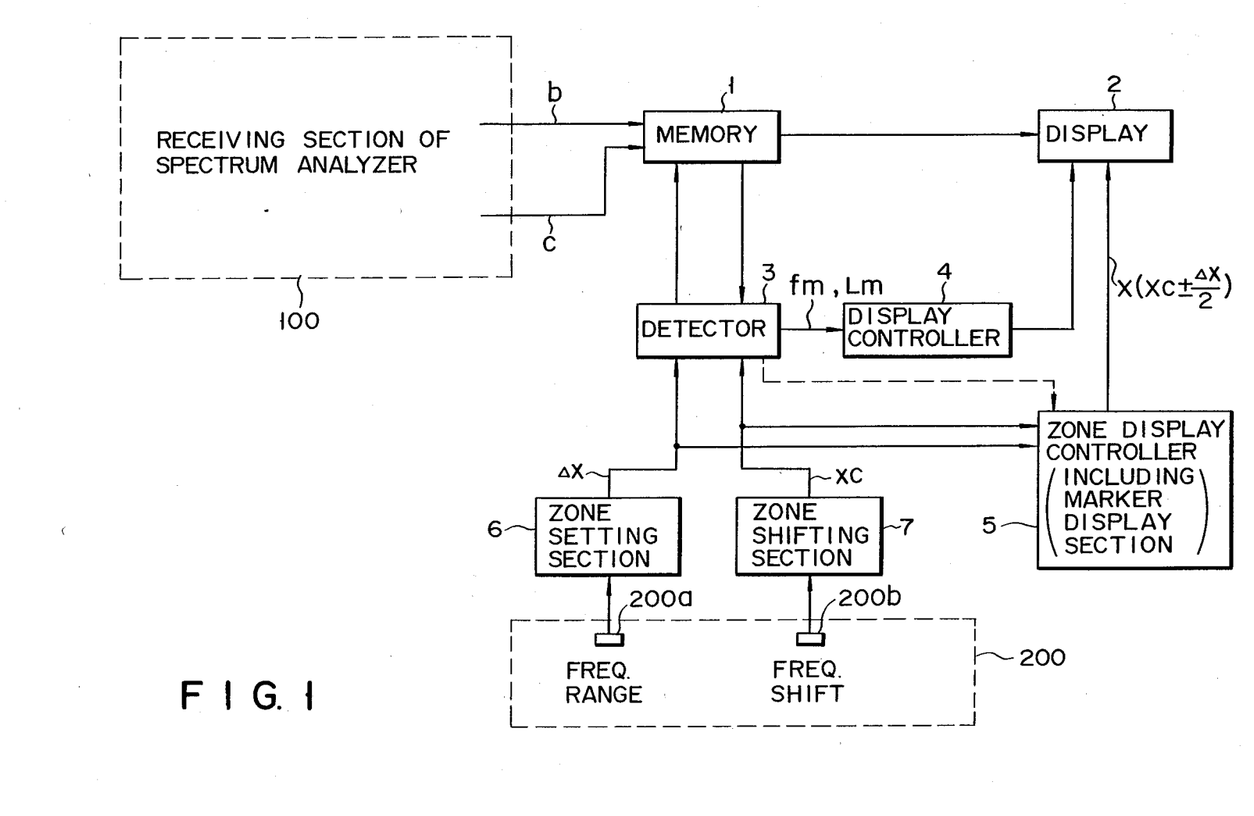
FIG. 1 is a block diagram showing first and second embodiments of the present invention.

In order to solve the above-mentioned drawbacks, according to the present invention, as shown in FIG. 1, there is provided a spectrum analyzer comprising memory 1 for storing a level of an input signal to be measured corresponding to a frequency within a measurement frequency region, and display 2 for displaying the level stored in the memory in correspondence with the frequency. The analyzer comprises zone setting section 6 for setting, as a zone, a desired frequency range in the measurement frequency region displayed on the display, zone shifting section 7 for shifting the frequency range set by the zone setting section within the measurement frequency region, zone display controller 5 for causing the display to display the frequency range set by the zone setting section, detector 3 for reading out data within the frequency range from the memory and detecting a maximum or minimum level in the readout data and a frequency corresponding to the maximum or minimum level, and display controller 4 for causing the display to digital-display the detected maximum or minimum level and frequency. This analyzer can quickly measure the level and frequency of a desired spectrum.

With the above arrangement, a frequency range is roughly set as a zone on the display screen for displaying an inverted V-shaped spectrum waveform, and the zone is shifted so that a desired spectrum falls within the zone. Thus, the level and frequency of the spectrum of interest can be displayed. On the display screen for displaying a V-shaped spectrum waveform, a zone is similarly set and shifted so that the V-shaped portion of the spectrum waveform falls within the zone. In this manner, the minimum level of the spectrum is detected, and the level and frequency of the spectrum can be displayed.

Some embodiments of the present invention will be described with reference to the accompanying drawings.

Figure 5:
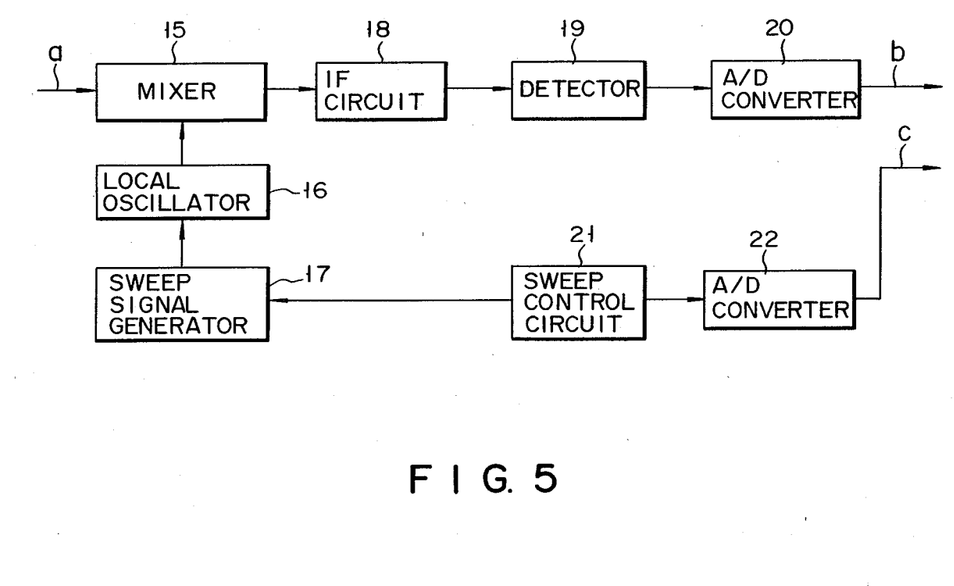
FIG. 5 is a block diagram showing a receiving section of a spectrum analyzer.

FIGS. 1 and 5 show an arrangement of a spectrum analyzer according to an embodiment (first embodiment) of the present invention.

Figure 2:
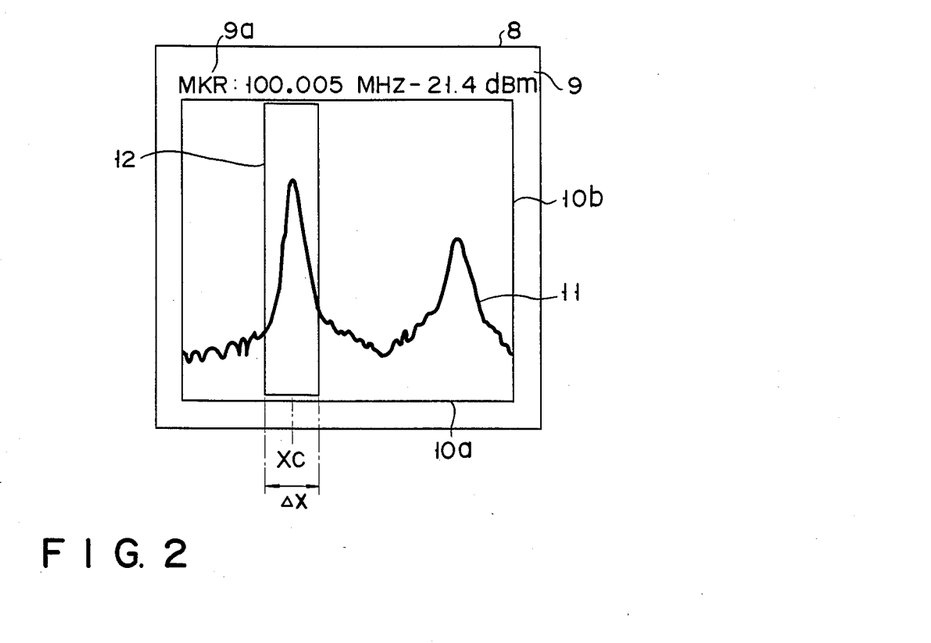
FIG. 2 is a view showing an example of display on a display screen of the first embodiment.

Spectrum analyzer receiving section 100 shown in FIG. 1 is arranged as shown in FIG. 5. Mixer 15 mixes signal a to be measured with a signal from local oscillator 16 to obtain an intermediate frequency (IF) signal. The IF signal is subjected to level detection in detector 19 through IF circuit 18. The level-detected signal is converted to a digital signal by A/D converter 20. The digital (level) data (b) is supplied to memory 1 (FIG. 1) connected to section 100. Sweep control circuit 21 sweeps a frequency of the local oscillator 16 within a desired range through sweep signal generator 17, and outputs frequency data c to memory 1 through A/D converter 22. Receiving section 100 sweeps the frequency region to be measured, and receives an input signal to be measured. As described above, memory 1 receives the digital (level) data from receiving section 100, and stores it as the level of the signal to be measured. Thereafter, memory 1 outputs the storage data to display 2. In response to the output signal from memory 1, display 2 displays spectrum 11 of the signal to be measured on display screen 8 shown in FIG. 2 together with horizontal and vertical scales 10a and 10b. Zone setting section 6 sets a desired frequency range as the width of zone 12 in the measurement frequency region, i.e., a frequency region displayed along horizontal scale 10a on display screen 8, and outputs zone width data $\Delta X$ of the desired frequency range to zone display controller 5 and detector 3. Zone shifting section 7 for shifting the position of zone 12 outputs position data Xc of zone 12 to controller 5 and detector 3. Sections 6 and 7 can be means for outputting desired data ΔX and Xc in response to the operations of knobs 200a and 200b on panel 200. Zone display controller 5 refers to horizontal scale 10a and determines the position and width (Xc±(ΔX/2)) of zone 12 on the horizontal axis, and sends the determined data to display 2. Display 2 displays desired zone 12 based on this data. Detector 3 determines the frequency region of the zone corresponding to Xc±(ΔX/2) based on zone data ΔX and Xc, reads out the digital data corresponding to the frequency region and performs arithmetic operations to search a maximum level point. Thus, frequency fm and level Lm of the maximum level point are obtained. Data fm and Lm are sent to display controller 4. Display controller 4 causes display 2 to perform digital (numerical) displays 9a and 9 of data fm and Lm within the desired zone as the frequency and level of the maximum level point. Since the above-mentioned arrangement is employed, according to the present invention, the zone width is set by operating knob 200a on panel 200 while observing the display screen, and zone 12 is shifted by operating knob 200b so that the desired spectrum falls within the zone. Then, the maximum level of the spectrum and its frequency can be detected. The width and position of the zone can be varied within the horizontal scale on the display screen. Thus, a zone of a desired width can be set, and the zone can be shifted to a desired position.

Figure 3:
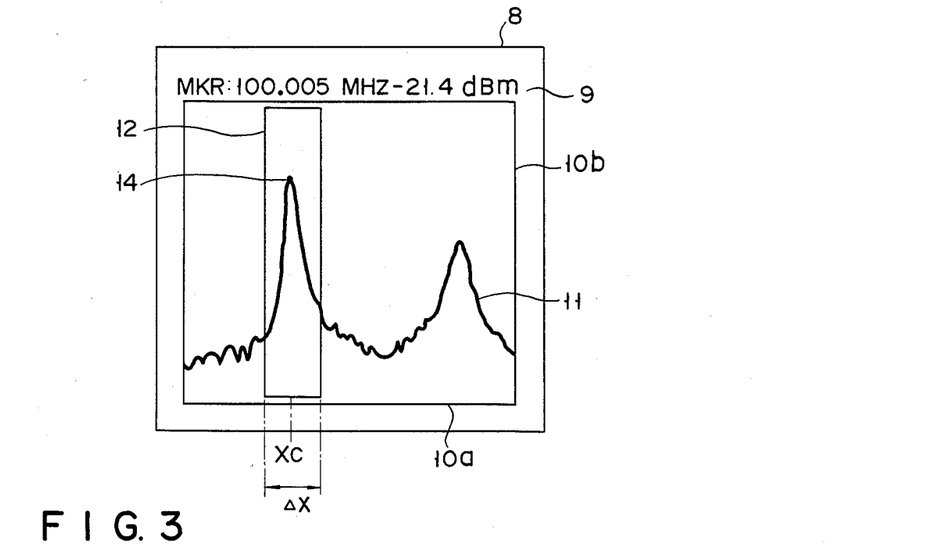
FIG. 3 is a view showing an example of display on a display screen of the second embodiment.

A dotted line between detector 3 and zone display controller 5 in FIG. 1 represents the arrangement f a second embodiment, and FIG. 3 shows an example of display on the display screen. In this embodiment, a marker display section is added to zone display controller 5 in the first embodiment. The marker display section receives maximum level Lm and frequency fm of the maximum level point within zone 12 from detector 3, and causes display screen 8 of display 2 to display marker 14 as a spot, thereby making the maximum level point easy to see. Marker 14 may have an arbitrary shape as well as a spot.

Figure 4:
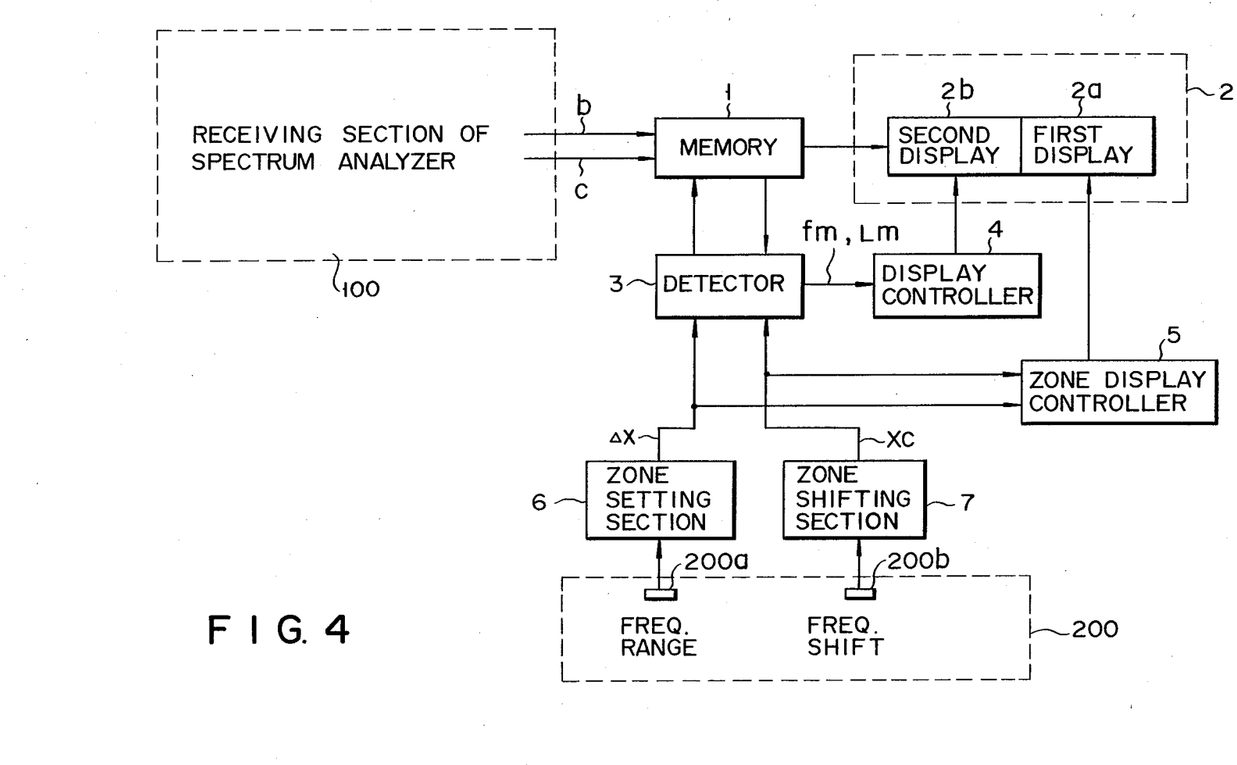
FIG. 4 is a block diagram showing a third embodiment of the present invention.

FIG. 4 shows the arrangement of a third embodiment. Display 2 in the first or second embodiment is divided into first display 2a for displaying a spectrum, and second display 2b for digitally displaying the level and frequency of a maximum level point. Second display 2b can employ an LED numerical display.

In the above embodiment, detector 3 detects the maximum level point within zone 12. However, detector 3 can detect a minimum level point within zone 12 or can detect both the maximum and minimum level points by modifying the arithmetic operation technique. It is easy to modify display controller 4, display 2, and zone display controller 5, accordingly.

Figure 6:
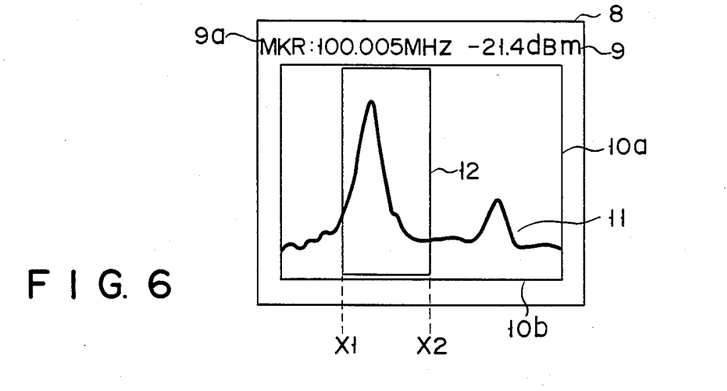
FIGS. 6, 7 and 8 are views showing different examples of display according to present invention.
Figure 7:
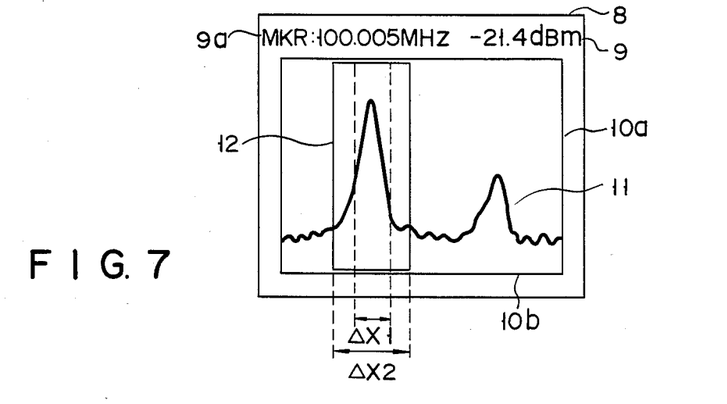
Figure 8:
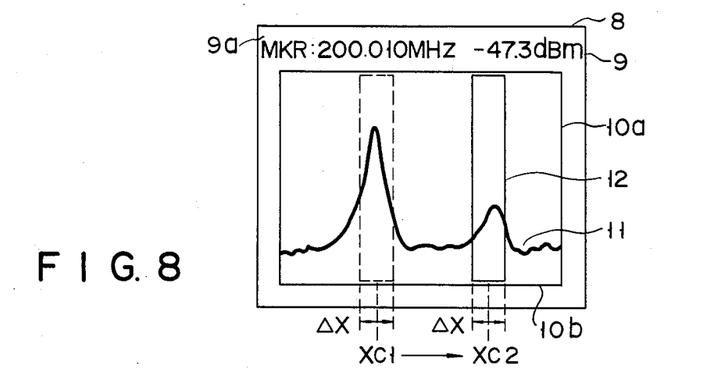

In the above embodiments, zone setting section 6 may set a zone width representing a desired frequency range at a time. However, section 6 may independently designate the left and right ends X1, X2 of a zone, as shown in FIG. 6. Also, section 6 may change the width of a zone, for example, to ΔX2 from ΔX, as shown in FIG. 7. Further, section 7 may shift the center position of a zone while keeping the width (ΔX) of the zone constant, for example, to XC1 from XC2, as shown in FIG. 8.

In FIGS. 2, 3, 6, 7 and 8, zone 12 is indicated by a rectangular frame. However, the present invention is not limited to this. For example, other techniques allowing visual observation of the range may be employed. For example, the luminance of a spectrum waveform within a designated range is increased, or a figure other than a rectangle representing the range is displayed along the horizontal axis.

In the spectrum analyzer, a zone having a desired frequency range is set on a display screen of a display which displays a spectrum of a signal to be measured. The zone is shifted to display the spectrum within the zone, so that the level and frequency of a maximum or minimum level point of a signal to be measured are displayed. Thus, the following effects can be provided.

Since the zone can be roughly set on a spectrum of a target signal to be measured, an operation is simple. Levels and frequencies of one or both of maximum and minimum level points of a spectrum can be quickly measured. Accurate measurement can be efficiently performed without an error caused when a spot of a marker is set upon visual observation, and without difficulty of setting due to transient response from a marker setting circuit to a display. Even if many signal spectra to be measured are displayed on the display screen, measurement can be quickly performed while decreasing the zone width and shifting the zone without being influenced by the levels of the spectra. With this arrangement, a frequency inside the spectrum analyzer is stable. As long as a frequency variation of a signal to be measured falls within the zone, measurement of the maximum or minimum level point and the like can be performed in accordance with a variation in frequency.

Note that in the above description, a spectrum is displayed. However, the present invention is not limited to this, and can be applied to a case wherein waveforms including wavelengths and physical characteristics are displayed.

What is claimed is:

1. A waveform measuring apparatus comprising:
input processing means for processing an input signal to be measured and outputting the input signal as a digital signal which represents a predetermined characteristic value corresponding to a predetermined measurement range;
memory means, connected to said input processing means, for storing the digital signal;
display means, connected to said memory means, for displaying the digital signal stored in said memory means as an image which is developed along one of the two-dimensional coordinates axes and represents the predetermined characteristic value;
zone setting means for outputting zone width data for designating, as a marker zone, a portion which includes a desired range of the one axis for the image displayed on said display means;
zone display control means, connected to said zone setting means and said display means, for causing said display means to display the marker zone in accordance with the zone width data;
detection means, connected to said memory means and said zone setting means, for reading out the digital signal within the desired range of the one axis from said memory means in accordance with the zone width data, and detecting a specific characteristic value in a readout digital signal; and
display control means, connected to said detection means and said display means, for causing said display means to display a detected specific characteristic value data.

2. An apparatus according to claim 1, wherein said input processing means comprises:

sweep signal generating means for generating a sweep signal which corresponds to the predetermined measurement range;

frequency converting means for receiving the sweep signal from said frequency sweep signal generating means, converting the input signal to be measured into a signal having a predetermined frequency and outputting the converted signal;

detecting means for detecting an output from said frequency converting means; and A/D conversion means for converting the detected signal from said detecting means into a digital signal representing the predetermined characteristic value.

3. An apparatus according to claim 1, wherein said zone setting means includes means for outputting zone width changing data which is capable of changing the width of the marker zone.

4. An apparatus according to claim 1, wherein said zone setting means includes means for outputting first and second zone width setting data for independently designating one and other ends of the marker zone.

5. An apparatus according to claim 1, wherein said zone display control means includes marker display means for causing said display means to display a marker which allows a position of the specific characteristic value detected by said detection means to be visually observed.

6. An apparatus according to claim 2, wherein the range of the sweep signal is within a measurement frequency region of the input signal to be measured, and the predetermined characteristic value is at the level of the input signal to be measured and is one of maximum and minimum levels of the input signal to be measured.

7. A waveform measuring apparatus comprising:
input processing means for processing an input signal to be measured and outputting the input signal as a digital signal which indicates a characteristic value corresponding to a predetermined measurement range;

memory means, connected to said input processing means, for storing the digital signal;

display means, connected to said memory means, for displaying the digital signal stored in said memory means as an image which is developed along one of the two-dimensional coordinates axes and which represents the predetermined characteristic value;

zone setting means for outputting zone shifting data for designating, as a marker zone, a portion including a desired range for the one axis of the image displayed on said display means;

zone shifting means for outputting zone shifting data for shifting the marker zone, set by said zone setting means, along the one axis on said display means;

zone display control means, connected to said zone setting means, said zone shifting means, and said display means, for causing said display means to display the marker zone in accordance with the zone width data and the zone shifting data;

detection means, connected to said memory means and said zone setting means and zone shifting means, for reading out the digital signal within the desired range of the one axis from said memory means, in accordance with the zone width data, and detecting a specific characteristic value in a readout digital signal; and display control means, connected to said detection means and said display means, for causing said display means to display a detected specific characteristic value data.

8. An apparatus according to claim 7, wherein said input processing means comprises:
sweep signal generating means for generating a sweep signal corresponding to the predetermined range;

frequency converting means for receiving the sweep signal from said frequency sweep signal generating means, converting the input signal to be measured into a signal having a predetermined frequency and outputting the converted signal;

detecting means for detecting an output from said frequency converting means; and A/D conversion means for converting the detected signal from said detecting means into a digital signal indicating the predetermined characteristic value.

9. An apparatus according to claim 7, wherein said zone setting means includes means for outputting zone width-change data capable of changing the width of the marker zone.

10. An apparatus according to claim 7, wherein said zone setting means includes means for outputting first and second zone width setting data for independently setting one and other ends of the marker zone.

11. An apparatus according to claim 7, wherein said zone display control means includes marker display means for causing said display means to display a marker which allows visual observation of a position of the specific characteristic value detected by said detection means.

12. An apparatus according to claim 8, wherein the range of the sweep signal is within a frequency measurement region of the input signal to be measured, and the predetermined characteristic value is a level of the input signal to be measured and is one of maximum and minimum levels of the input signal to be measured.

13. An apparatus according to claim 7, wherein said zone shifting means includes means for outputting zone shifting data for shifting the marker zone set by said zone shifting means, while keeping the width of the marker zone constant.

14. A waveform measuring apparatus comprising:
a memory for storing a level of an input signal to be measured corresponding to a frequency within a frequency measurement region;

a display for displaying the level of what stored in said memory in correspondence with the frequency;

zone setting means for setting, as a zone, a desired frequency range in the frequency measurement region displayed on said display;

zone shifting means for shifting the frequency range set by said zone setting means within the frequency measurement region;

zone display control means for causing said display to display the frequency range set by said zone setting means;

detection means for reading out data within the frequency zone from said memory and detecting a maximum or minimum level in the readout data and a frequency corresponding to the maximum or minimum level; and display control means for causing said display to digitally-display the detected maximum or minimum level and frequency.

15. An apparatus according to claim 14, wherein said zone setting means includes means capable for varying, as a zone width, the width of the frequency range within the frequency measurement region.

16. An apparatus according to claim 14, wherein said zone shifting means includes means for shifting the zone as the frequency range within the frequency measurement region, while keeping the zone width constant.

17. An apparatus according to claim 14, wherein said zone setting means includes means capable of setting specific frequencies of left and right ends of the zone as the frequency range within the frequency measurement region.

18. An apparatus according to claim 14, wherein said zone display control means includes marker display means for causing said display to display a visible marker at position of the maximum or minimum level of what the readout data detected by said detection means.

* * * * *